United States Patent
Tung (10) Patent No.: US 9,590,114 B1
(45) Date of Patent: Mar. 7, 2017

(54) SEMICONDUCTOR DEVICE AND METHOD OF MANUFACTURING THE SAME

(71) Applicant: UNITED MICROELECTRONICS CORP., Hsinchu (TW)

(72) Inventor: Yu-Cheng Tung, Kaohsiung (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 14/873,617

(22) Filed: Oct. 2, 2015

(30) Foreign Application Priority Data

Aug. 28, 2015 (TW) .............................. 104128325 A (51) Int. Cl.
*H01L 29/49* (2006.01)
*H01L 29/786* (2006.01)
*H01L 29/66* (2006.01)
*H01L 29/423* (2006.01)

(52) U.S. Cl.
CPC .... *H01L 29/7869* (2013.01); *H01L 29/42364* (2013.01); *H01L 29/42372* (2013.01); *H01L 29/66969* (2013.01)

(58) Field of Classification Search
CPC ........... H01L 29/7869; H01L 29/42364; H01L 29/42372; H01L 29/66969
See application file for complete search history.

(56) References Cited

U.S. PATENT DOCUMENTS

| | | | |
|---|---|---|---|
| 8,759,186 B2 | 6/2014 | Yeh et al. | |
| 2013/0009147 A1* | 1/2013 | Koyama | H01L 21/02422 257/43 |
| 2013/0221347 A1* | 8/2013 | Isobe | H01L 29/66742 257/43 |
| 2013/0228775 A1* | 9/2013 | Noda | H01L 29/66742 257/43 |
| 2014/0061810 A1 | 3/2014 | Sunamura et al. | |
| 2015/0155312 A1 | 6/2015 | Yamazaki | |

* cited by examiner

*Primary Examiner* — Michael Shingleton
(74) *Attorney, Agent, or Firm* — WPAT, PC; Justin King (57) ABSTRACT

A semiconductor device is provided, comprising a substrate with a first insulating film formed thereon, and a transistor formed on the first insulating film. The transistor at least comprises an oxide semiconductor layer formed on the first insulating film, a first gate insulation film formed on the oxide semiconductor layer, a gate electrode formed above the first gate insulation film, and spacers formed on the oxide semiconductor layer. The spacers at least cover the sidewalls of the first gate insulation film and the sidewalls of the gate electrode. The gate electrode has a gate width and the first gate insulation film has a first width, wherein the gate width is different from the first width.

21 Claims, 12 Drawing Sheets

SEMICONDUCTOR DEVICE AND METHOD OF MANUFACTURING THE SAME

This application claims the benefit of Taiwan application Serial No. 104128325, filed Aug. 28, 2015, the subject matter of which is incorporated herein by reference.

BACKGROUND

Technical Field

The disclosure relates in general to a semiconductor device and method of manufacturing the same, and more particularly to a semiconductor device having transistor comprising oxide semiconductor layer and method of manufacturing the same.

Description of the Related Art

A semiconductor device with transistors formed using semiconductor thin films has been known. Attention has been focused on a technique for forming transistors using semiconductor thin films over a substrate having an insulating surface. The transistor has been widely used for semiconductor electronic devices such as integrated circuits (ICs) and display devices. Typically, a silicon-based semiconductor material is commonly known as a material for a semiconductor thin film of the transistor. An oxide semiconductor which is another material applicable to the transistor also attracts attention.

For the semiconductor device with transistors using the oxide semiconductor film, the layers laminated on the oxide semiconductor film should be reliable and resisted to the entry of the impurities. For example, if hydrogen penetrates into the layers such as oxide semiconductor film (comprising a channel region), it would cause undesirable effect on the electrical characteristics of the device, such as generation of the leakage current. Accordingly, it is desired to construct a reliable structure for a semiconductor device having transistor comprising oxide semiconductor layer to improve the electrical performance of the semiconductor device as well as prolongs the lifetimes of the products in the application.

SUMMARY

The disclosure is directed to a semiconductor device and method of manufacturing the same, which is capable of constructing a reliable structure, thereby improving the electrical properties of the semiconductor device.

According to the disclosure, a semiconductor device is provided, comprising a substrate with a first insulating film formed thereon, and a transistor formed on the first insulating film. The transistor at least comprises an oxide semiconductor layer formed on the first insulating film, a first gate insulation film formed on the oxide semiconductor layer, a gate electrode formed above the first gate insulation film, and spacers formed on the oxide semiconductor layer. The spacers at least cover the sidewalls of the first gate insulation film and the sidewalls of the gate electrode. The gate electrode has a gate width and the first gate insulation film has a first width, wherein the gate width is different from the first width.

According to the disclosure, a method of manufacturing a semiconductor device is provided, comprising: providing a substrate with a first insulating film formed thereon; and forming a transistor on the first insulating film, wherein the transistor at least comprises an oxide semiconductor layer formed on the first insulating film, a first gate insulation film formed on the oxide semiconductor layer, a gate electrode formed above the first gate insulation film, and spacers formed on the oxide semiconductor layer and covering sidewalls of the first gate insulation film and sidewalls of the gate electrode, wherein the gate electrode has a gate width, the first gate insulation film has a first width, and the gate width is different from the first width.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the present disclosure, a semiconductor device and method of manufacturing a semiconductor device are disclosed. The embodiment provides a reliable structure for a semiconductor device, especially for the semiconductor device having transistor comprising oxide semiconductor layer, so as to improve the electrical performance of the semiconductor device as well as prolongs the lifetimes of the products applied with the embodied semiconductor device. Also, the method of the embodiment provides a self-aligned process for manufacturing a semiconductor device with a self-aligned configuration, such as self-aligned source/drain formation.

Several embodiments are provided hereinafter with reference to the accompanying drawings for describing the related configurations and procedures, but the present disclosure is not limited thereto. It is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily drawn to scale. Thus, the specification and the drawings are to be regard as an illustrative sense rather than a restrictive sense.

First Embodiment

Figure 1A:
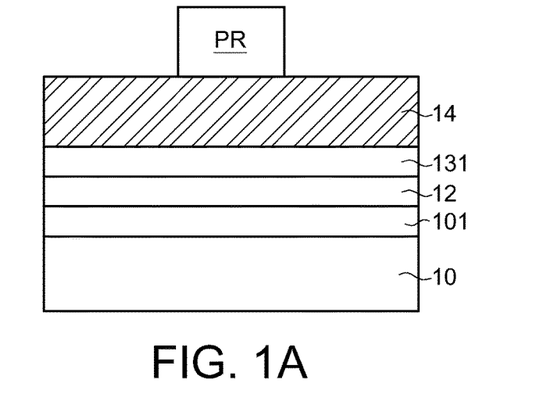
FIG. 1A-FIG. 1H schematically illustrate a method of manufacturing a semiconductor device according to the first embodiment of the present disclosure.

FIG. 1A-FIG. 1H schematically illustrate a method of manufacturing a semiconductor device according to the first embodiment of the present disclosure. First, a stack including a substrate 10 with a first insulating film 101 formed thereon, an oxide semiconductor layer 12 formed on the first insulating film 101, a first gate insulation film 131 formed on the oxide semiconductor layer 12, and a gate electrode layer 14 formed above the first gate insulation film 131 is provided, and a patterned photo-resist (PR) is formed on the gate electrode layer 14, as shown in FIG. 1A.

Figure 1B:
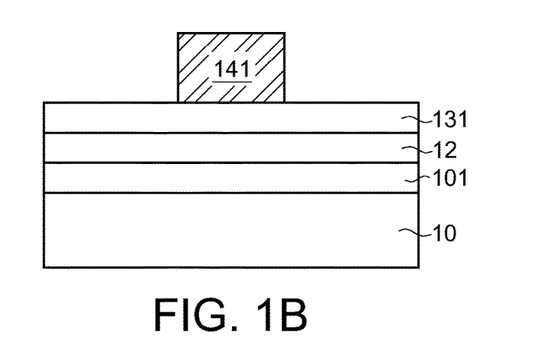

The gate electrode layer 14 is processed into an island shape, such as being etched according to the patterned photo-resist (PR) to form a gate electrode 141, as shown in FIG. 1B.

In one embodiment, the first gate insulation film 131 could be an oxide insulation film, such as silicon oxide, silicon oxynitride, and a Ga—Zn-based metal oxide.

Also, the gate electrode layer 14 (gate electrode 141) can be formed of: a metal material such as molybdenum, titanium, tantalum, tungsten, aluminum, copper, chromium, neodymium, or scandium; an alloy material which includes any of these materials as a main component; polycrystalline silicon doped with an impurity element such as phosphorus; silicide such as nickel silicide; indium tin oxide; indium oxide containing tungsten oxide; indium zinc oxide containing tungsten oxide; indium oxide containing titanium oxide; indium tin oxide containing titanium oxide; indium zinc oxide; indium tin oxide to which silicon oxide is added; or a metal oxide containing nitrogen, specifically an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film.

Figure 1C:
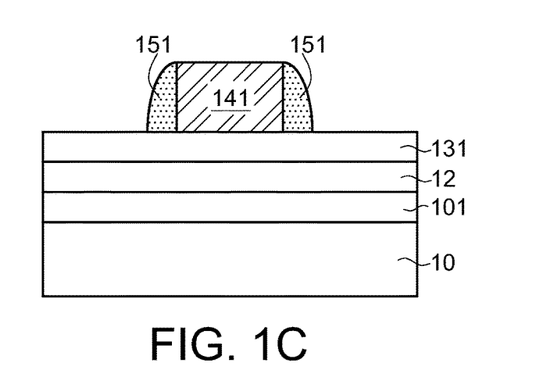

In FIG. 1C, the first spacing portions 151 are formed on the first gate insulation film 131 and covers the sidewalls of the gate electrode 141.

Figure 1D:
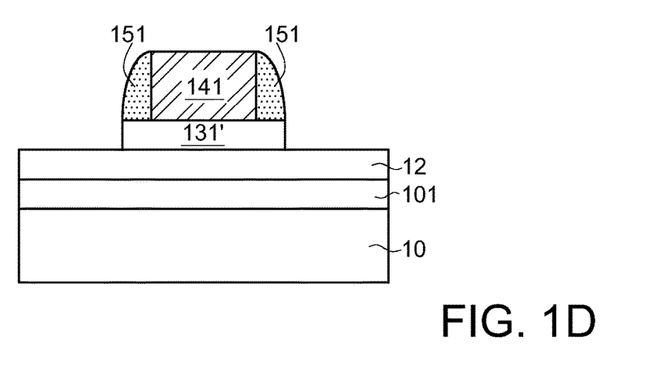

In FIG. 1D, a first gate insulation film 131' with a defined pattern is formed by etching the first gate insulation film 131 (FIG. 1C) according to the first spacing portions 151 surrounding the gate electrode 141.

Figure 1E:
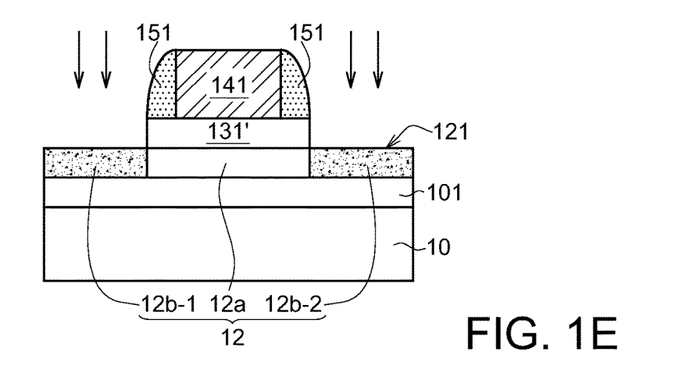

Next, by using an integration of the first spacing portions 151, the gate electrode 14 and the first gate insulation film 131' as a mask, suitable dopants are introduced into the oxide semiconductor layer 12 (ex: arrows in FIG. 1E), so that a pair of regions containing the dopants, such as the first low-resistance region 12b-1 and the second low-resistance region 12b-2, are formed as shown in FIG. 1E. Also, in the first embodiment, the region overlapping with the gate electrode 141 and the first spacing portions 151 contains no dopant and serves as a channel region 12a. The first low-resistance region 12b-1 and the second low-resistance region 12b-2 serve as a source region and a drain region, respectively.

By adding the dopants to the oxide semiconductor layer 12, the first low-resistance region 12b-1 and the second low-resistance region 12b-2 can be amorphous. Since hydrogen tends to be diffused into an amorphous oxide semiconductor, hydrogen in the channel region 12a is diffused into the first and second low-resistance regions 12b-1 and 12b-2 so that the hydrogen concentration in the channel region 12a can be reduced, and the first and second low-resistance regions 12b-1 and 12b-2 can be an n-type (have a low resistance). As a result, on-state current of the transistor can be increased.

In one embodiment, the dopants added into the oxide semiconductor layer 12 can be conducted using an ion doping method or an ion implantation method. Examples of dopants could be at least one of boron, nitrogen, phosphorus, and arsenic. In another embodiment, at least one of helium, neon, argon, krypton, and xenon can be added as the dopants. Moreover, after adding dopants, a heat treatment may be optionally performed to further reduce the resistance of the first low-resistance region 12b-1 and the second low-resistance region 12b-2. In the heat treatment, the first low-resistance region 12b-1 and the second low-resistance region 12b-2 containing the dopants may be in either a crystalline state or an amorphous state.

Figure 1F:
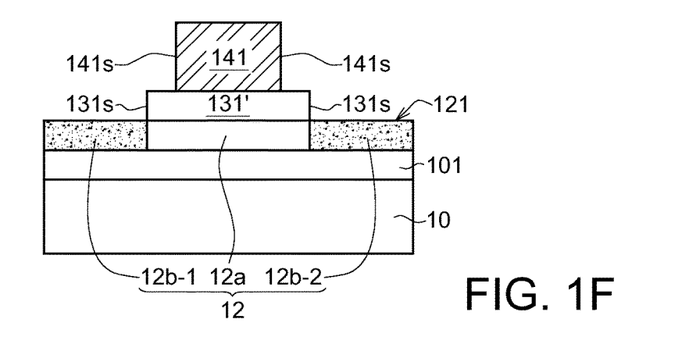

Next, in the first embodiment, the first spacing portions 151 are removed, as shown in FIG. 1F.

Figure 1G:
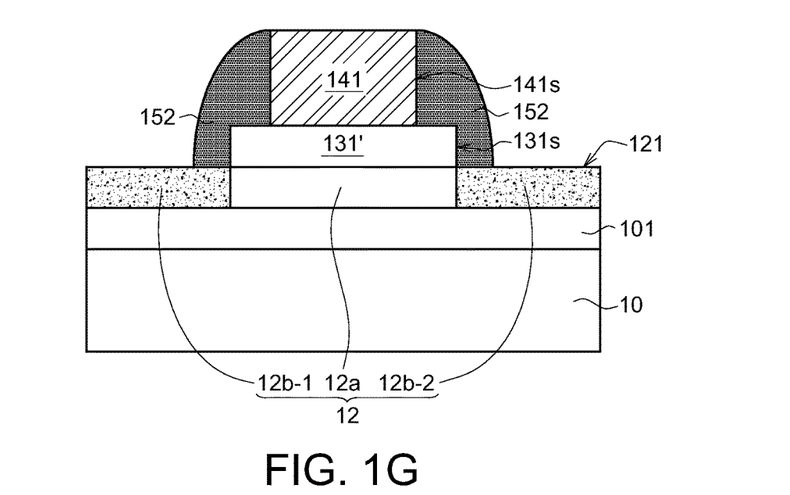

Subsequently, the second spacing portions 152 are formed on the oxide semiconductor layer 12, such as directly contacting the upper surface 121 of the oxide semiconductor layer 12, and the second spacing portions 152 covers the sidewalls 131s of the first gate insulation film 131' and the sidewalls 141s of the gate electrode 141, as shown in FIG. 1G. In one embodiment, the second spacing portions 152 are made from a high-k dielectric material.

Figure 1H:
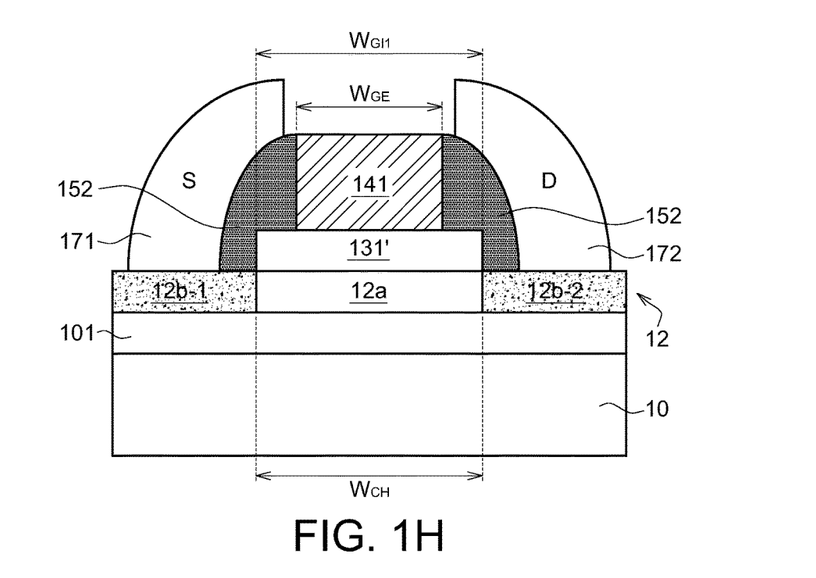

In FIG. 1H, a first electrode 171 and a second electrode 172 are formed to electrically connect the first low-resistance region 12b-1 and the second low-resistance region 12b-2, respectively. Contact plugs (not shown in figures) formed subsequently will be in contact (ex: vertical contact) with the first electrode 171 and the second electrode 172 to communicate other wires or elements stacked above the transistor structure of the embodiment.

FIG. 1H depicts a semiconductor device according to the first embodiment of the present disclosure. In the first embodiment, the gate electrode 141 has a gate width $W_{GE}$, the first gate insulation film 131' has a first width $W_{GI1}$, and the gate width $W_{GE}$ is different from the first width $W_{GI1}$. Also, the channel region 12a has a channel width $W_{CH}$, and the channel width $W_{CH}$ is larger than the gate width $W_{GE}$ of the gate electrode 141. As shown in FIG. 1H, the channel width $W_{CH}$ is substantially equal to the first width $W_{GI1}$ of the first gate insulation film 131'. Also, in the first embodiment, the first electrode 171 and the second electrode 172 directly contact the second spacing portions 152 (i.e. spacers), as shown in FIG. 1H. However, the present disclosure is not limited thereto, the first electrode 171 and the second electrode 172 can be spaced apart from the spacers, as long as achieving electrical connection to the first low-resistance region 12b-1 and the second low-resistance region 12b-2, respectively.

Second Embodiment

In the first embodiment, a single layer of the gate insulation film is exemplified for illustration. However, the multi-layered gate insulation can be adopted, and the disclosure has no particular limitation to the numbers of the gate insulation film. In the second embodiment, a second gate insulation film is further formed between the first gate insulation film and the gate electrode. Also, a hard mask is further formed on the gate electrode of the semiconductor device in the second embodiment.

FIG. 2A-FIG. 2H schematically illustrate a method of manufacturing a semiconductor device according to the second embodiment of the present disclosure. The same or similar elements of the second and first embodiments are designated with the same or similar reference numerals. Please also refer to the first embodiment for the descriptions of the related elements, and the details are not redundantly repeated.

Figure 2A:
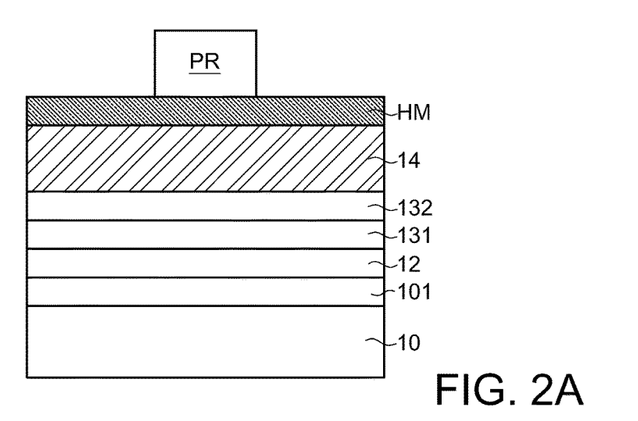
FIG. 2A-FIG. 2H schematically illustrate a method of manufacturing a semiconductor device according to the second embodiment of the present disclosure.

First, a stack including a substrate 10 with a first insulating film 101 formed thereon, an oxide semiconductor layer 12 formed on the first insulating film 101, a first gate insulation film 131 formed on the oxide semiconductor layer 12, a second gate insulation film 132 formed on the first gate insulation film 131, a gate electrode layer 14 formed on the second gate insulation film 132 and a hard mask HM formed on the gate electrode layer 14 is provided. Also, a patterned photo-resist (PR) is formed on the hard mask HM, as shown in FIG. 2A.

In one embodiment, the hard mask HM may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. The disclosure is not limited thereto.

In one embodiment, the first gate insulation film 131 could be an oxide insulation film, such as silicon oxide, silicon oxynitride, and a Ga—Zn-based metal oxide. In one embodiment, the second gate insulation film 132 could be a metal oxide film, and may be formed to have a stacked-layer structure or a single-layer structure using, for example, aluminum oxide, aluminum oxynitride, gallium oxide, gallium oxynitride, yttrium oxide, yttrium oxynitride, hafnium oxide, and hafnium oxynitride. Also, a high-k material such as hafnium oxide, hafnium oxynitride, yttrium oxide, or yttrium oxynitride can be optionally selected for forming the second gate insulation film 132 for reducing the gate leakage of the transistor.

Figure 2B:
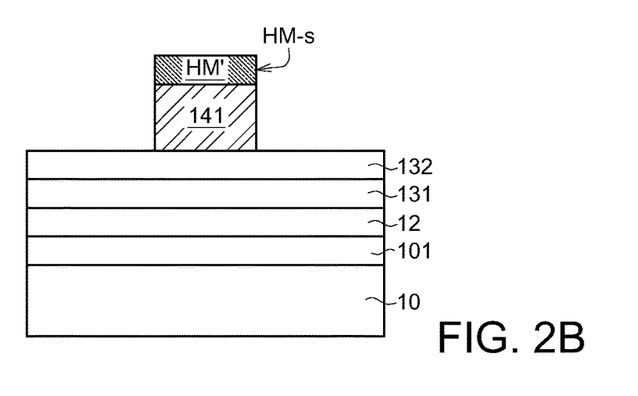

Afterwards, the hard mask HM and the gate electrode layer 14 are processed into an island shape, such as being etched according to the patterned photo-resist (PR) to form a gate electrode 141 and the hard mask HM', as shown in FIG. 2B. The patterned photo-resist (PR) is then removed.

Figure 2C:
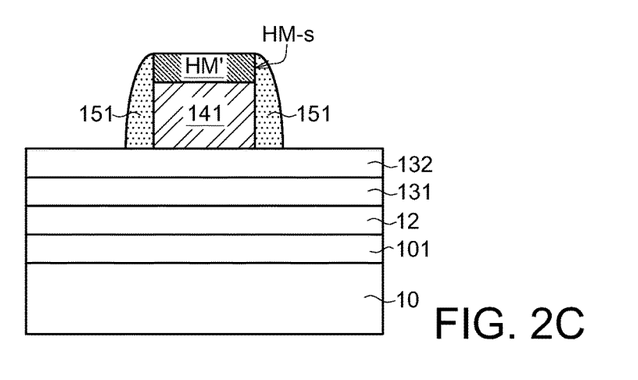

Next, the first spacing portions 151 are formed on the second gate insulation film 132 and covers the sidewalls of the gate electrode 141 and the hard mask HM', as shown in FIG. 2O. In one embodiment, the first spacing portions 151 reach the top surface of the hard mask HM'.

Figure 2D:
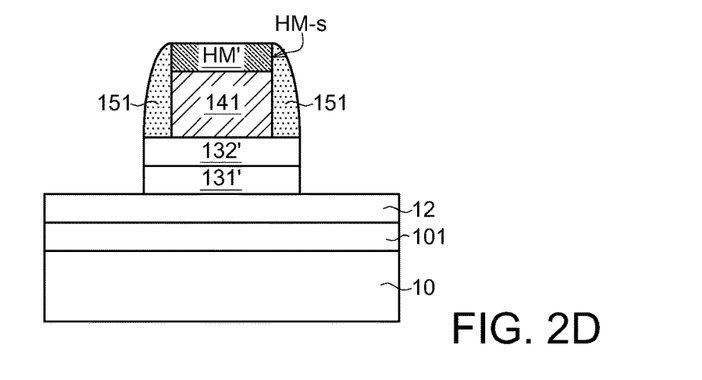

Then, a second gate insulation film 132' and a first gate insulation film 131' with defined patterns are formed by etching the first gate insulation film 131 and the second gate insulation film 132 according to the first spacing portions 151 surrounding the hard mask HM' and the gate electrode 141, as shown in FIG. 2D.

Figure 2E:
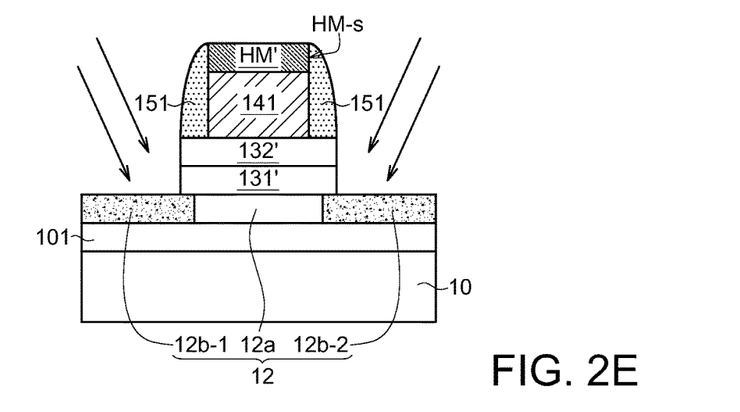

Next, by using an integration of the first spacing portions 151, the hard mask NM', the gate electrode 14, the second gate insulation film 132' and the first gate insulation film 131' as a mask, suitable dopants are introduced into the oxide semiconductor layer 12 (ex: arrows in FIG. 2E), so that a pair of regions containing the dopants, such as the first low-resistance region 12b-1 and the second low-resistance region 12b-2, are formed as shown in FIG. 2E. Also, in the second embodiment, the region beneath the gate electrode 141 and the first spacing portions 151 containing no dopant serves as a channel region 12a, wherein the first low-resistance region 12b-1 and the second low-resistance region 12b-2 serve as a source region and a drain region, respectively.

In the first embodiment, the channel width $W_{CH}$ is substantially equal to the first width $W_{GI1}$ of the first gate insulation film 131'. However, the present disclosure is not limited thereto, and the channel width $W_{CH}$ could be different from the first width $W_{GI1}$ of the first gate insulation film 131', by slightly modifying the processing way. For example, by tilting the implanting direction towards the substrate 10, as shown in FIG. 2E, the implantation is performed towards to the channel region 12a. In the second embodiment, the channel width $W_{CH}$ is smaller than the first width $W_{GI1}$ of the first gate insulation film.

Figure 2F:
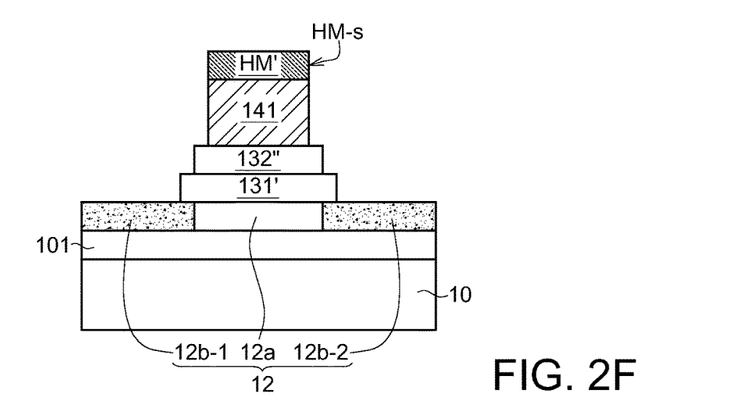

Afterward, the first spacing portions 151 are removed, as shown in FIG. 2F. In one embodiment, the first spacing portions 151 may be made of silicon nitride, and can be removed by wet etching using heated phosphoric acid ($H_3PO_4$). During removal of the first spacing portions 151, part of the second gate insulation film 132' could be removed as well so as to form a second gate insulation film 132". Accordingly, the widths of the second gate insulation film 132" and the widths of the first gate insulation film 131' would be different.

Figure 2G:
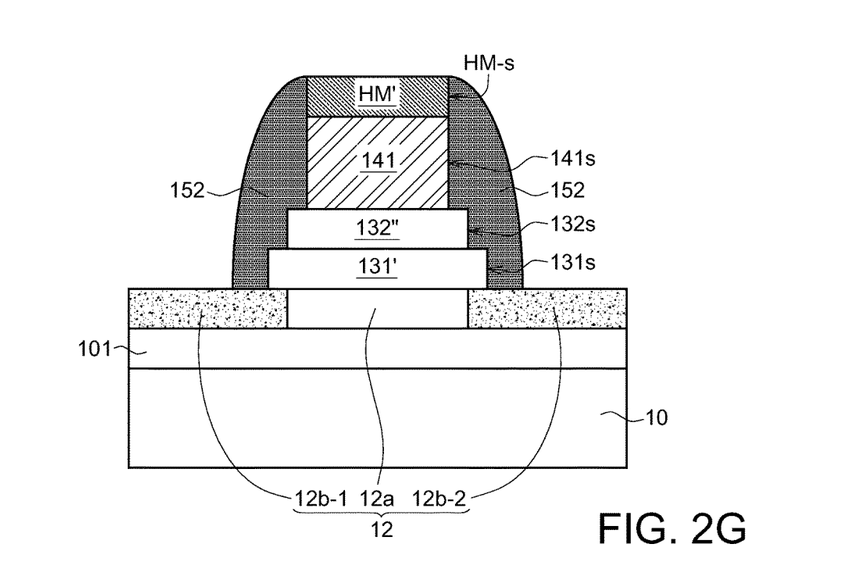

Subsequently, the second spacing portions 152 are formed on the oxide semiconductor layer 12, such as directly contacting the upper surface 121 of the oxide semiconductor layer 12, and the second spacing portions 152 also covers the sidewalls 131s of the first gate insulation film 131', the sidewalls 132s of the second gate insulation film 132", the sidewalls 141s of the gate electrode 141 and the sidewalls HM-s of the hard mask HM', as shown in FIG. 2G. In one embodiment, the second spacing portions 152 are made from a high-k dielectric material.

Figure 2H:
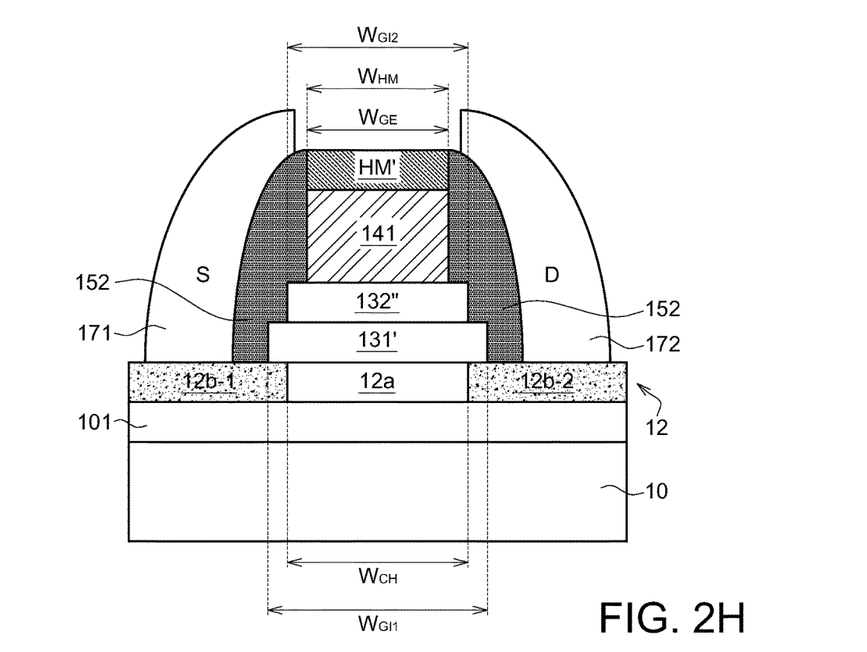

In FIG. 2H, a first electrode 171 and a second electrode 172 are formed to electrically connect the first low-resistance region 12b-1 and the second low-resistance region 12b-2, respectively. Formation of the hard mask HM' over the gate electrode 141 is optionally provided in order to prevent contact between the gate electrode 141 and the first electrode 171/the second electrode 172. Contact plugs (not shown in figures) formed subsequently will be in contact (ex: vertical contact) with the first electrode 171 and the second electrode 172 to communicate other wires or elements stacked above the transistor structure of the embodiment.

FIG. 2H depicts a semiconductor device according to the second embodiment of the present disclosure. In the second embodiment, the gate electrode 141 has a gate width $W_{GE}$, the first gate insulation film 131' has a first width $W_{GI1}$, and the second gate insulation film 132" has a second width $W_{GI2}$. The gate width $W_{GE}$ is different from the first width $W_{GI1}$, and the first width $W_{GI1}$ is different from the second width $W_{GI2}$. As shown in FIG. 2H, the first width $W_{GI1}$ is larger than the second width $W_{GI2}$. Also, the channel region 12a has a channel width $W_{CH}$, and the channel width $W_{CH}$ is larger than the gate width $W_{GE}$ of the gate electrode 141 but smaller than the first width $W_{GI1}$ of the first gate insulation film 131'. According to the second embodiment, the hard mask HM' has a hard mask width $W_{HM}$, wherein the hard mask width $W_{HM}$ is substantially equal to the gate width $W_{GE}$. The hard mask width $W_{HM}$ is smaller than the first width $W_{GI1}$ of the first gate insulation film 131', and also smaller than the channel width $W_{CH}$. Also, in the second embodiment, the first electrode 171 and the second electrode 172 directly contact the second spacing portions 152 (i.e. spacers), as illustrated in FIG. 2H. However, the present disclosure is not limited thereto, the first electrode 171 and the second electrode 172 can be spaced apart from the spacers, as long as achieving electrical connection to the first low-resistance region 12b-1 and the second low-resistance region 12b-2, respectively.

Third Embodiment

In the third embodiment, a hard mask on the gate electrode and two gate insulation films under the gate electrode are formed for exemplifying the third embodiment. Also, in the first and second embodiments, the second spacing portions 152 are formed on the oxide semiconductor layer 12 and positioned adjacent to the sidewalls 131s of the first gate insulation film 131' (and the sidewalls 132s of the second gate insulation film 132"). However, the disclosure is not limited thereto. The electrical connection between the first electrode 171/the second electrodes 172 and the first low-resistance region 12b-1/the second low-resistance region 12b-2 can still be effectively achieved by forming another configuration of the spacers which are not identical to the configurations of the second spacing portions 152 in the first and second embodiments.

FIG. 3A-FIG. 3H schematically illustrate a method of manufacturing a semiconductor device according to the third embodiment of the present disclosure. The same or similar elements of the first, second and third embodiments are designated with the same or similar reference numerals. Please also refer to the first and second embodiments for the descriptions of the related elements.

Figure 3A:
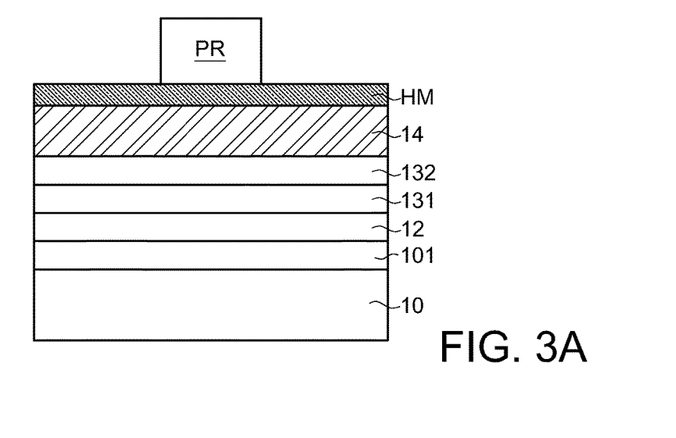
FIG. 3A-FIG. 3H schematically illustrate a method of manufacturing a semiconductor device according to the third embodiment of the present disclosure.
Figure 3B:
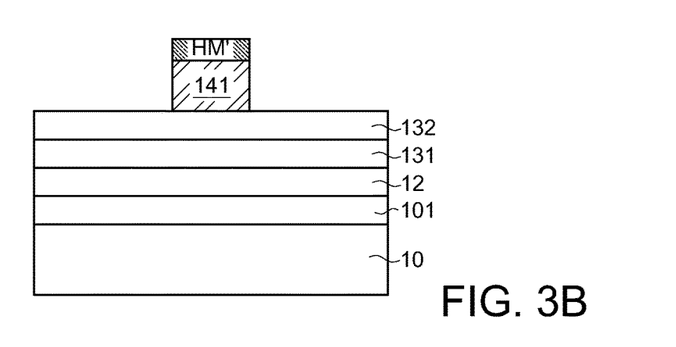
Figure 3C:
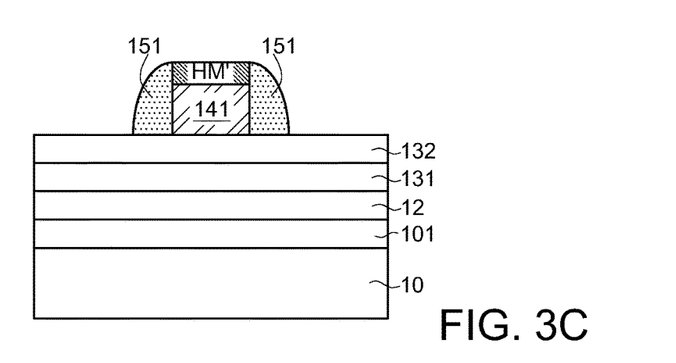
Figure 3D:
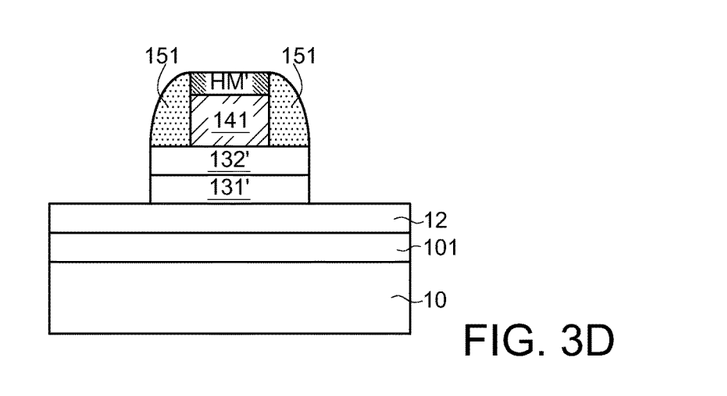
Figure 3E:
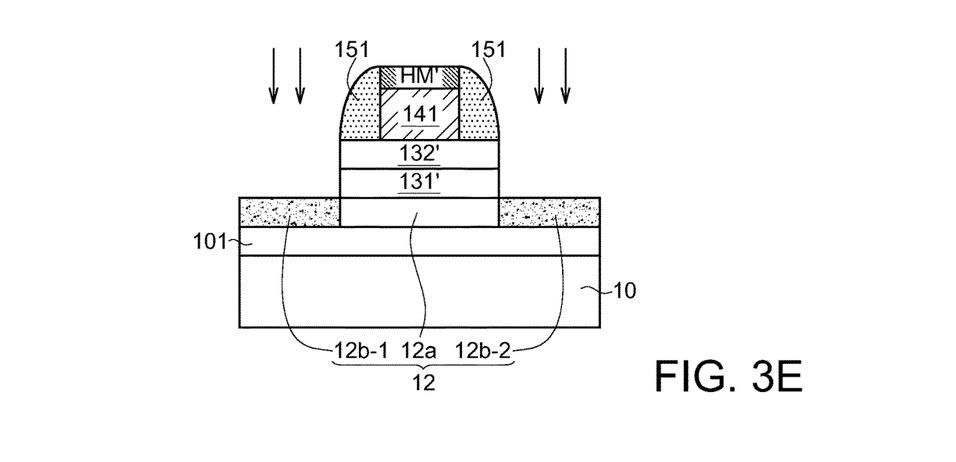
Figure 3F:
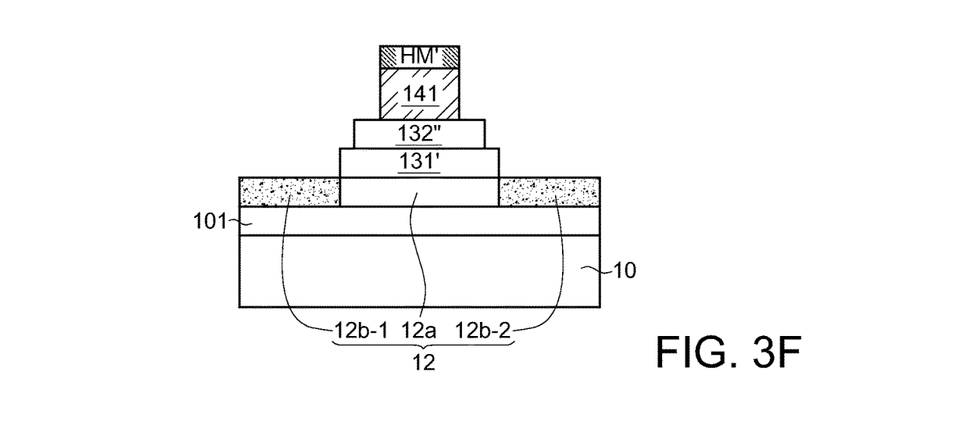

Processes and configurations of FIG. 3A-FIG. 3F are identical to that of FIG. 2A-FIG. 2F, except for the channel width $W_{CH}$ of the channel region 12a. In the third embodiment, the channel width $W_{CH}$ of the channel region 12a is substantially identical to the first width $W_{GI1}$ of first gate insulation film 131' (FIG. 3E). The details of the processes and the configurations are not redundantly repeated here.

Figure 3G:
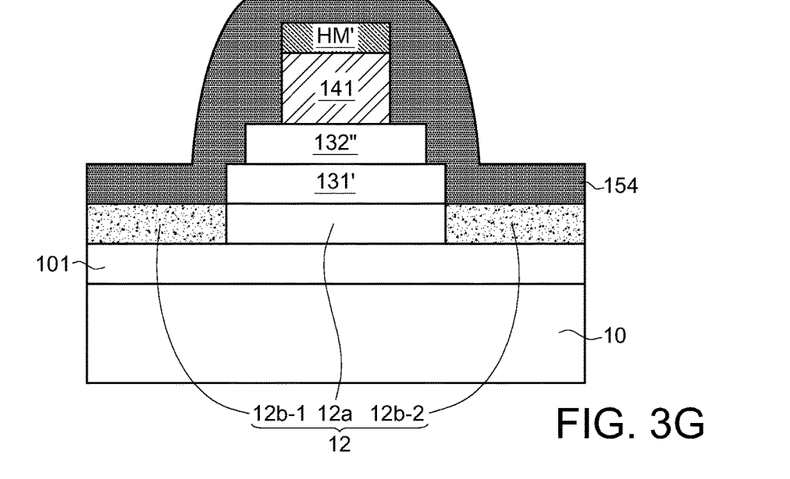

In the third embodiment, a spacing film 154 is deposited on the oxide semiconductor layer 12 and conformably covers the first gate insulation film 131', the second gate insulation film 132" and the gate electrode 141, as shown in FIG. 3G, so as to form the spacers (the same function as the second spacing portions 152 in the first and second embodiments) covering and contacting the sidewalls 131s of the first gate insulation film 131', the sidewalls 132s of the second gate insulation film 132", the sidewalls 141s of the gate electrode 141 and the sidewalls HM-s of the hard mask HM'. In one embodiment, the spacing film 154 comprises a high-k dielectric material.

Figure 3H:
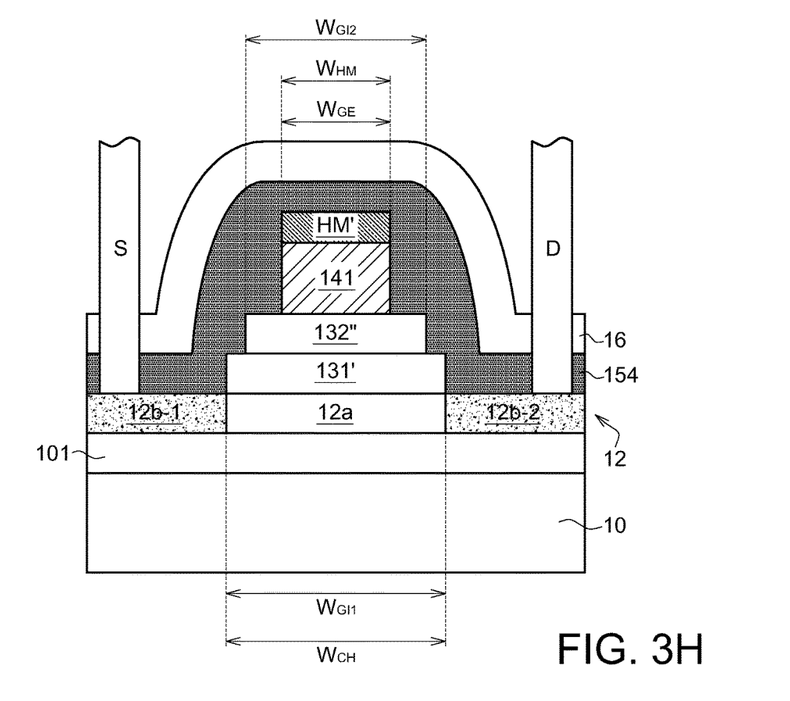

Afterward, a second insulating film 16 is formed on the spacing film 154 and conformably covers the spacing film 154 and the elements beneath, as shown in FIG. 3H. A first electrode (labeled as "S" in FIG. 3H) and a second electrode (labeled as "D" in FIG. 3H) penetrate the second insulating film 16 and the spacing film 154, thereby electrically connecting the first low-resistance region 12b-1 and the second low-resistance region 12b-2, respectively.

FIG. 3H depicts a semiconductor device according to the third embodiment of the present disclosure. In the third embodiment, the gate width $W_{GE}$ of the gate electrode 141 is different from the first width $W_{GI1}$ of the first gate insulation film 131"; i.e. $W_{GI1} > W_{GE}$. Also, the second width $W_{GI2}$ of the second gate insulation film 132' and the first width $W_{GI1}$ of the first gate insulation film 131" are also different; i.e. $W_{GI1} > W_{GI2}$. As shown in FIG. 3H, the channel width $W_{CH}$ is substantially equal to the first width $W_{GI1}$ of the first gate insulation film 131", but larger than the second width $W_{GI2}$ of the second gate insulation film 132'. According to the third embodiment, the hard mask HM' has a hard mask width $W_{HM}$, wherein the hard mask width $W_{HM}$ is substantially equal to the gate width $W_{GE}$. As shown in FIG. 3H, the widths of related elements in the third embodiment can be denoted as $W_{CH} = W_{GI1} > W_{GI2} > W_{GE} = W_{HM}$.

Fourth Embodiment

In the fourth embodiment, a hard mask HM on the gate electrode 141 and two of the gate insulation films under the gate electrode 141 are formed for exemplifying the fourth embodiment. Also, in the first, second and third embodiments, the first spacing portions 151 have been completely removed before forming the second spacing portions 152 or the spacing film 154. However, the disclosure is not limited thereto. It is applicable that the final structure of the transistor contains two different spacing portions as the spacers, by slightly modifying the manufacturing method.

FIG. 4A-FIG. 4G schematically illustrate a method of manufacturing a semiconductor device according to the fourth embodiment of the present disclosure. The same or similar elements of the first, second, third and fourth embodiments are designated with the same or similar reference numerals. Please also refer to the first, second and third embodiments for the descriptions of the related elements.

Figure 4A:
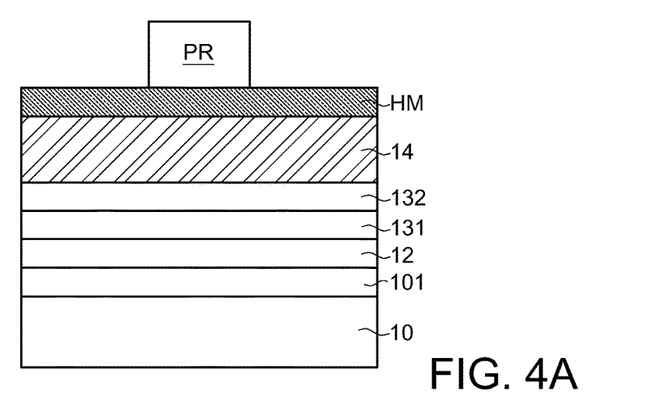
FIG. 4A-FIG. 4G schematically illustrate a method of manufacturing a semiconductor device according to the fourth embodiment of the present disclosure.

First, a stack including a substrate 10 with a first insulating film 101 formed thereon, an oxide semiconductor layer 12 formed on the first insulating film 101, a first gate insulation film 131 formed on the oxide semiconductor layer 12, a second gate insulation film 132 formed on the first gate insulation film 131, a gate electrode layer 14 formed on the second gate insulation film 132 and a hard mask HM formed on the gate electrode layer 14 is provided. Also, a patterned photo-resist (PR) is formed on the hard mask HM, as shown in FIG. 4A.

Figure 4B:
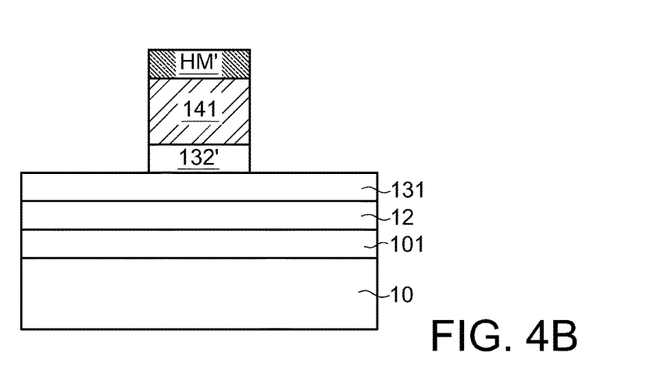

The hard mask HM, the gate electrode layer 14 and the second gate insulation film 132 are processed into an island shape, such as being etched according to the patterned photo-resist (PR) to form a gate electrode 141, the hard mask HM' and the second gate insulation film 132', as shown in FIG. 4B. The patterned photo-resist (PR) is then removed.

Figure 4C:
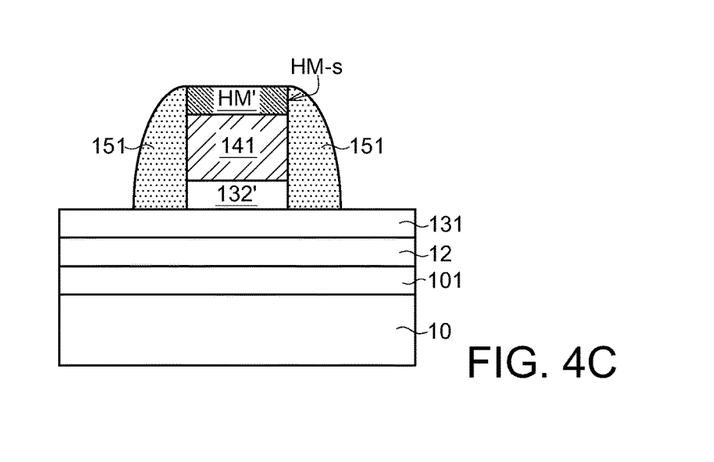

Next, the first spacing portions 151 are formed on the first gate insulation film 131, and covers the sidewalls 132s of the second gate insulation film 132', the sidewalls 141s of the gate electrode 141 and the sidewalls HM-s of the hard mask HM', as shown in FIG. 4C. In one embodiment, the first spacing portions 151 reach the top surface of the hard mask HM'.

Figure 4D:
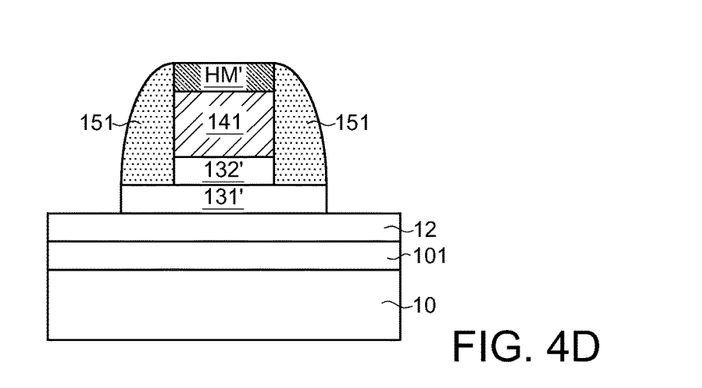
Figure 4E:
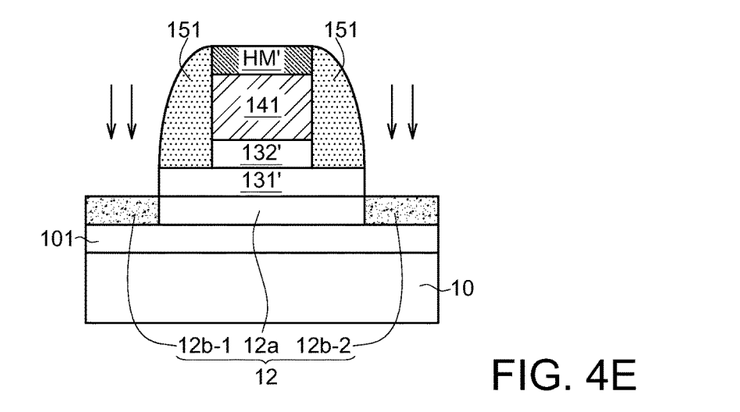

Then, a first gate insulation film 131' with defined pattern is formed by etching according to the first spacing portions 151 surrounding the hard mask HM', the gate electrode 141 and the second gate insulation film 132', as shown in FIG. 4D.

Next, by using an integration of the first spacing portions 151, the hard mask HM', the gate electrode 14, the second gate insulation film 132' and the first gate insulation film 131' as a mask, suitable dopants are introduced into the oxide semiconductor layer 12 (ex: arrows in FIG. 4E), so that a pair of regions (i.e. the first low-resistance region 12b-1 and the second low-resistance region 12b-2) and a channel region 12a beneath the gate electrode 141 and the first spacing portions 151 containing no dopant. The first low-resistance region 12b-1 and the second low-resistance region 12b-2 serve as a source region and a drain region, respectively.

Figure 4F:
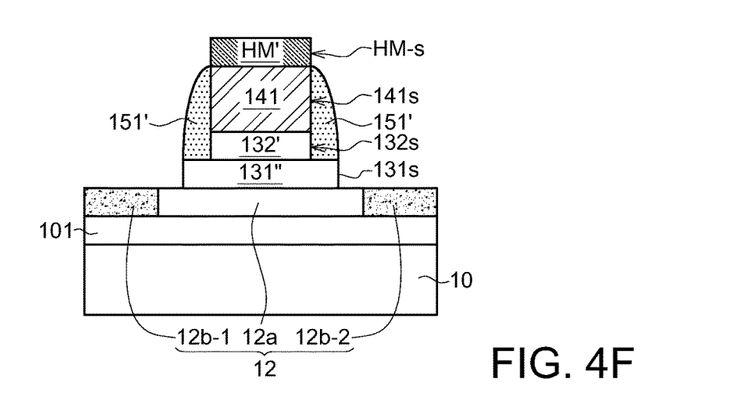

Afterward, the first spacing portions 151 are thinned (i.e. removing parts of the first spacing portions 151), as shown in FIG. 4F. During thinning the first spacing portions 151, part of the first gate insulation film 131' could be removed as well so as to form a first gate insulation film 131". In one embodiment, the first spacing portions 151' covers the sidewalls 132s of the second gate insulation film 132' and the sidewalls 141s of the gate electrode 141, and the bottom of the first spacing portions 151' is substantially aligned with the sidewalls 131s of the first gate insulation film 131" after thinning procedure. Accordingly, the width $W_{CH}$ of the channel region 12a is larger than the first width $W_{GI1}$ of the first gate insulation film 131".

Subsequently, the second spacing portions 152 are formed on the oxide semiconductor layer 12 (such as directly contacting the upper surface 121 of the oxide semiconductor layer 12) and encapsulates the first spacing portions 151'.

Figure 4G:
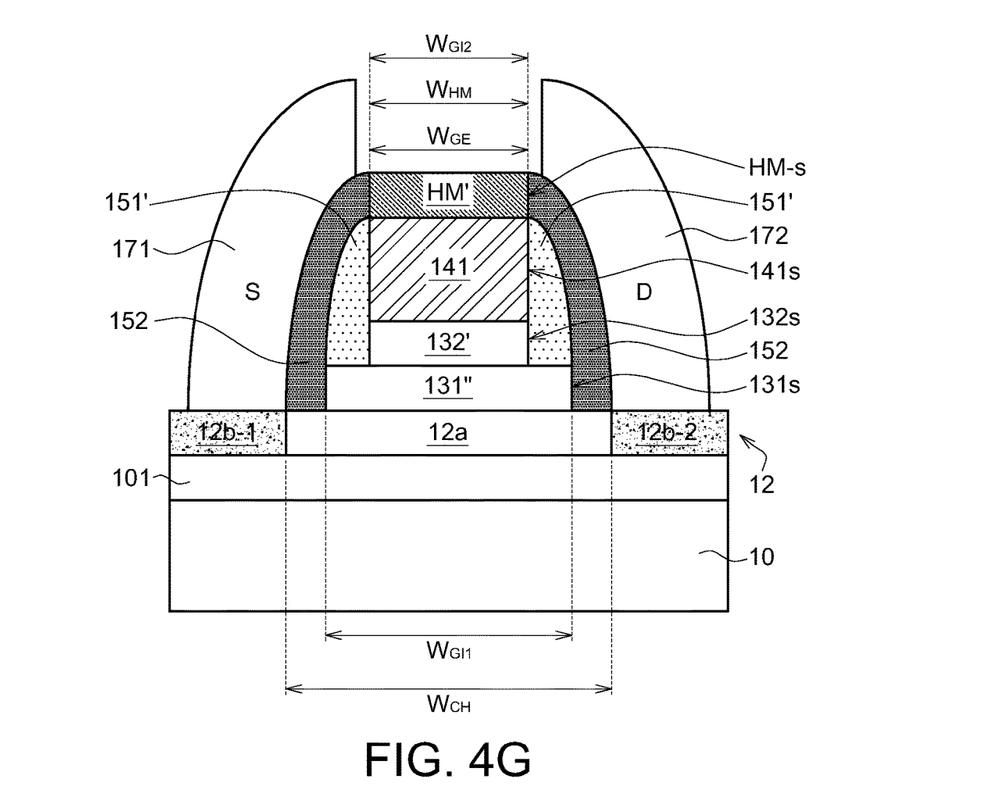

Also, the second spacing portions 152 covers the sidewalls 131s of the first gate insulation film 131" and the sidewalls HM-s of the hard mask HM', as shown in FIG. 4G. Moreover, a first electrode 171 and a second electrode 172 are formed, such as by directly contacting the second spacing portions 152, to electrically connect the first low-resistance region 12b-1 and the second low-resistance region 12b-2, respectively.

In one embodiment, the first spacing portions 151/151' is made from a first dielectric material, and the second spacing portions 152 is made from a second dielectric material, wherein the first dielectric material is different from the second dielectric material. In one embodiment, the second spacing portions 152 are made from a high-k dielectric material.

FIG. 4G depicts a semiconductor device according to the fourth embodiment of the present disclosure. In the fourth embodiment, the gate width $W_{GE}$ of the gate electrode 141 is different from the first width $W_{GI1}$ of the first gate insulation film 131"; i.e. $W_{GI1} > W_{GE}$. Also, the second width $W_{GI2}$ of the second gate insulation film 132' and the first width $W_{GI1}$ of the first gate insulation film 131" are also different; i.e. $W_{GI1} > W_{GI2}$. As shown in FIG. 4G, the channel width $W_{CH}$ is larger than the first width $W_{GI1}$ of the first gate insulation film 131", and larger than the second width $W_{GI2}$ of the second gate insulation film 132' and larger than the gate width $W_{GE}$ of the gate electrode 141. According to the fourth embodiment, the hard mask HM' has a hard mask width $W_{HM}$, wherein the hard mask width $W_{HM}$ is substantially equal to the gate width $W_{GE}$. As shown in FIG. 4G, the widths of related elements in the fourth embodiment can be denoted as $W_{CH} > W_{GI1} > W_{GI2} = W_{GE} = W_{HM}$. Similarly, in the fourth embodiment, the first electrode 171 and the second electrode 172 are not limited to directly contact the second spacing portions 152 (FIG. 4G), and can be spaced apart from the second spacing portions 152, as long as achieving electrical connection to the first low-resistance region 12b-1 and the second low-resistance region 12b-2, respectively.

According to the aforementioned descriptions, the embodied semiconductor device comprises the spacers (i.e. the second spacing portions 152/the spacing film 154) formed on the oxide semiconductor layer (12) and at least covering the sidewalls of the first gate insulation film (131'/131") and the sidewalls of the gate electrode (141), wherein the gate width of the gate electrode is different from the first width of the first gate insulation film. The embodiment provides a reliable structure, especially for the semiconductor device having transistor comprising oxide semiconductor layer, thereby improving the electrical characteristics of the semiconductor device. Accordingly, the products applied with the embodied semiconductor device have great electrical performance and prolonged lifetimes. Also, the method of the embodiment provides a self-aligned process for manufacturing the embodied semiconductor device with a self-aligned configuration, such as self-aligned source and drain.

Other embodiments with different configurations (ex: positions, shapes and sizes) of the contacts (i.e. the first electrode 171 and the second electrode 172), the gate electrode 141, the first low-resistance region 12b-1/the channel region 12a/the second low-resistance region 12b-2 (ex: source/channel/drain), are also applicable and could be varied depending on the actual needs of the applications. For example, the widths of those elements could be modified or changed. It is, of course, noted that the configurations of FIG. 1A-1H, FIG. 2A-FIG. 2H, FIG. 3A-FIG. 3H, and FIG. 4A-FIG. 4G are depicted only for demonstration, not for limitation. It is known by people skilled in the art that the shapes or positions of the constituting elements could be adjusted and modified according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate with a first insulating film formed thereon;
   a transistor formed on the first insulating film, and the transistor at least comprising:
   an oxide semiconductor layer formed on the first insulating film;
   a first gate insulation film formed on the oxide semiconductor layer;
   a gate electrode formed above the first gate insulation film; and
   spacers formed on the oxide semiconductor layer and at least covering sidewalls of the first gate insulation film and sidewalls of the gate electrode, wherein the spacer does not cover top surface of the gate electrode,
   wherein the gate electrode having a gate width, the first gate insulation film having a first width, and the gate width is different from the first width.

2. The semiconductor device according to claim 1, wherein the transistor further comprises a second gate insulation film formed on the first gate insulation film, and the gate electrode is formed on the second gate insulation film, and the spacers further cover sidewalls of the second gate insulation film, wherein the second gate insulation film has a second width, and the first width is different from the second width.

3. The semiconductor device according to claim 2, wherein the gate width is substantially equal to the second width.

4. The semiconductor device according to claim 1, wherein the transistor further comprises a hard mask deposited on the gate electrode, and the spacers further cover sidewalls of the hard mask.

5. The semiconductor device according to claim 1, wherein the oxide semiconductor layer comprises a first low-resistance region, a second low-resistance region and a channel region positioned between the first low-resistance region and the second low-resistance region, and the channel region has a channel width, and the transistor further comprises a first electrode and a second electrode electrically connected to the first low-resistance region and the second low-resistance region respectively.

6. The semiconductor device according to claim 5, wherein the channel width is substantially equal to the first width of the first gate insulation film.

7. The semiconductor device according to claim 5, wherein the channel width is larger than the gate width of the gate electrode.

8. The semiconductor device according to claim 5, wherein the channel width is smaller than the first width of the first gate insulation film.

9. The semiconductor device according to claim 5, wherein the first electrode and the second electrode directly contact the spacers.

10. The semiconductor device according to claim 5, further comprising a second insulating film formed on the first insulating film and covering the transistor, wherein the first electrode and the second electrode penetrate the second insulating film for electrically connecting the first low-resistance region and the second low-resistance region respectively.

11. The semiconductor device according to claim 1, wherein a spacing film is deposited on the oxide semiconductor layer and conformably covers the first gate insulation film and the gate electrode, so as to form the spacers contacting the sidewalls of the first gate insulation film and the sidewalls of the gate electrode.

12. The semiconductor device according to claim 11, further comprising a second insulating film formed on the spacing film and covering the transistor, wherein the transistor further comprises a first electrode and a second electrode penetrating the second insulating film and the spacing film, thereby electrically connecting the first low-resistance region and the second low-resistance region respectively.

13. The semiconductor device according to claim 1, wherein the spacers comprise a high-k dielectric material.

14. The semiconductor device according to claim 1, wherein the spacers comprises:
    first spacing portions, made from a first dielectric material, formed on the first gate insulation film and covering the sidewalls of the gate electrode; and
    second spacing portions, made from a second dielectric material, formed on the oxide semiconductor layer and encapsulating the first spacing portions, wherein the second spacing portions covers the sidewalls of the first gate insulation film,
    wherein the first dielectric material is different from the second dielectric material.

15. A method of manufacturing a semiconductor device, comprising:
    providing a substrate with a first insulating film formed thereon;
    forming a transistor on the first insulating film, wherein the transistor at least comprises:
        an oxide semiconductor layer formed on the first insulating film;
        a first gate insulation film formed on the oxide semiconductor layer;
        a gate electrode formed above the first gate insulation film; and
        spacers formed on the oxide semiconductor layer and covering sidewalls of the first gate insulation film and sidewalls of the gate electrode, wherein the spacer does not cover top surface of the gate electrode,
    wherein the gate electrode has a gate width, the first gate insulation film has a first width, and the gate width is different from the first width.

16. The method according to claim 15, wherein the transistor further comprises a second gate insulation film formed on the first gate insulation film, and the gate electrode is formed on the second gate insulation film, and the spacers further cover sidewalls of the second gate insulation film, wherein the second gate insulation film has a second width, and the first width is different from the second width.

17. The method according to claim 16, wherein the first width is larger than the second width.

18. The method according to claim 16, wherein the gate width is smaller than the second width.

19. The method according to claim 16, wherein the oxide semiconductor layer comprises a first low-resistance region, a second low-resistance region and a channel region positioned between the first low-resistance region and the second low-resistance region, and the channel region has a channel width, wherein the second width of the second gate insulation film is smaller than the channel width.

20. The method according to claim 15, wherein the spacers comprises:
    first spacing portions, made from a first dielectric material, formed on the first gate insulation film and covering the sidewalls of the gate electrode; and
    second spacing portions, made from a second dielectric material, formed on the oxide semiconductor layer and encapsulating the first spacing portions, wherein the second spacing portions covers the sidewalls of the first gate insulation film,
    wherein the first dielectric material is different from the second dielectric material, and the second dielectric material is a high-k dielectric material.

21. A semiconductor device, comprising:
    a substrate with a first insulating film formed thereon;
    a transistor formed on the first insulating film, and the transistor at least comprising:
        an oxide semiconductor layer formed on the first insulating film;
        a first gate insulation film formed on the oxide semiconductor layer;
        a second gate insulation film formed on the first gate insulation film;
        a gate electrode formed above the second gate insulation film; and
        spacers formed on the oxide semiconductor layer and at least covering sidewalls of the first gate insulation film, sidewalls of the second gate insulation film and sidewalls of the gate electrode,
    wherein the gate electrode having a gate width, the first gate insulation film having a first width, the second gate insulation film has a second width, and the gate width is different from the first width while the first width is different from the second width, wherein the second gate insulation film and the first gate insulation film together form a stepped structure.

* * * * *